(12) United States Patent
Yu

(10) Patent No.: US 6,198,423 B1
(45) Date of Patent: Mar. 6, 2001

(54) ANALOG-TO-DIGITAL CONVERTER SYSTEM HAVING ENHANCED DIGITAL SELF-CALIBRATION

(75) Inventor: Paul C. Yu, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/211,906

(22) Filed: Dec. 15, 1998

Related U.S. Application Data

(60) Provisional application No. 60/068,757, filed on Dec. 23, 1997.

(51) Int. Cl.[7] .................................................. H03M 1/12
(52) U.S. Cl. ............................................. 341/172; 341/120
(58) Field of Search ..................................... 341/172, 161, 341/143, 120, 118, 155, 156; 340/347 CC

(56) References Cited

U.S. PATENT DOCUMENTS

| 4,399,426 | * | 8/1983 | Tan ......................................... 340/347 |
| 4,894,656 | * | 1/1990 | Hwang et al. ........................ 341/120 |
| 5,416,485 | * | 5/1995 | Lee ........................................ 341/172 |
| 5,499,027 | * | 3/1996 | Karanicolas et al. ................ 341/120 |

* cited by examiner

Primary Examiner—Brian Young
Assistant Examiner—John Nguyen
(74) Attorney, Agent, or Firm—Alan K. Stewart; Wade James Brady, III; Frederick J. Telecky, Jr.

(57) ABSTRACT

An analog-to-digital converter system 10 is provided that comprises an analog-to-digital converter pipeline 12 coupled to a memory system 14 and a calibration system 16. An arithmetic logic unit 18 receives a raw output from the analog-to-digital converter system 12 and calibration quantities from the calibration system 16 to generate a calibrated output. The calibration system 16 is able to iteratively generate multiple order calibration values that can be used to eliminate capacitor mismatch errors. The techniques described are equally applicable to analog-to-digital converter architectures which resolve multiple bits per stage of the analog-to-digital converter system.

17 Claims, 1 Drawing Sheet

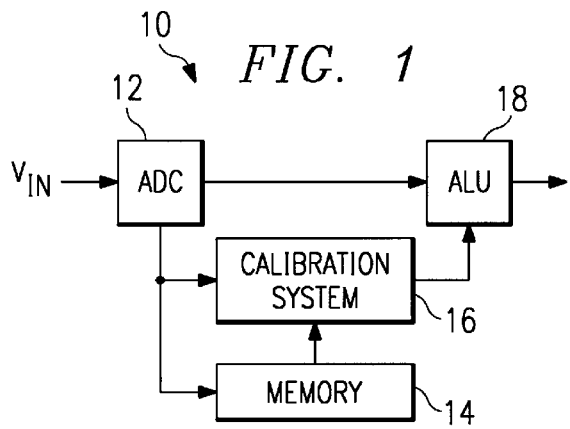
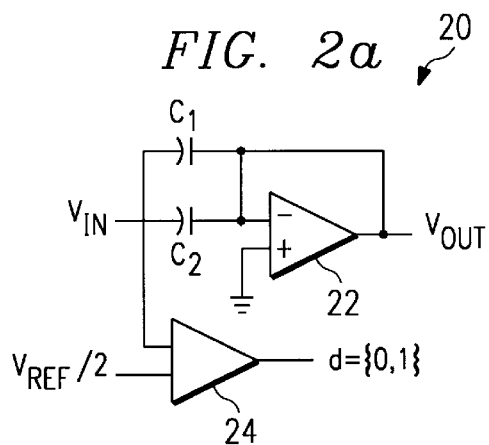
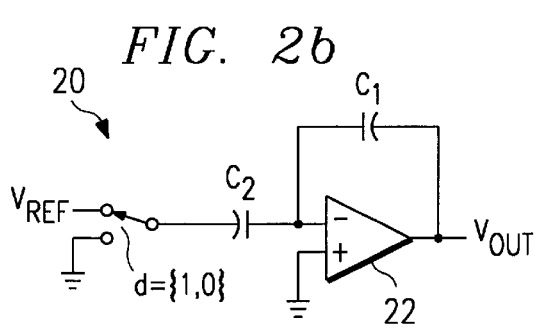
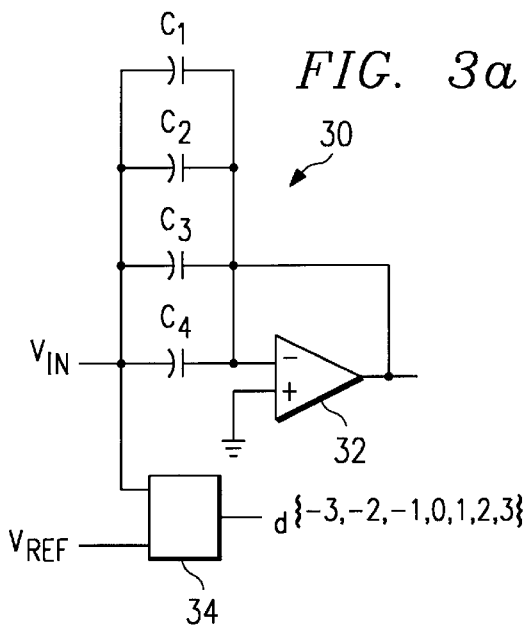
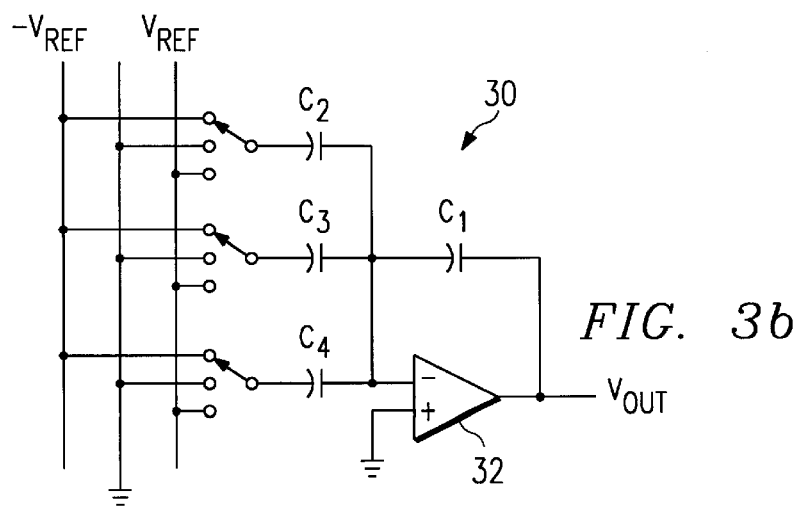

ANALOG-TO-DIGITAL CONVERTER SYSTEM HAVING ENHANCED DIGITAL SELF-CALIBRATION

This application claims priority under 35 USC § 119(e)(1) of provisional application No. 60/068,757 filed Dec. 23, 1997.

TECHNICAL FIELD OF THE INVENTION

This invention relates in general to the field of electronic systems, and more particularly, to an improved analog-to-digital converter system having enhanced digital self-calibration capabilities.

BACKGROUND OF THE INVENTION

Analog-to-digital converter systems can be used to convert continuously varying signals such as analog representations of sound into digital codes for storage and for processing in the digital domain. One popular architecture for analog-to-digital converter systems is an algorithmic analog-to-digital converter. Algorithmic analog-to-digital converters can be implemented using modern CMOS technology using switched capacitor techniques. In these architectures, accurate conversion of an analog signal to a digital representation relies on the assumption that the capacitors in the switched capacitor array all have the same capacitive value. No matter how good the processes used to create the capacitors, this is not an entirely valid assumption. The mismatch in the capacitors effects the resolution of the algorithmic analog-to-digital converter. This capacitor mismatch is typically expressed as a number of bits and with modern CMOS technology the capacitor matching is typically 8–10 bits.

One technique to improve the resolution of an analog-to-digital converter is through the use of digital calibration. In this approach, a calibration cycle is performed to measure an error due to the mismatch of the capacitors in the system. The digitized error quantity is stored in a memory system. Calibration logic can then take the stored error quantity and compute a necessary correction to the output of the analog-to-digital converter.

Although certainly more effective than non-calibrated systems, systems that use this calibration technique have a limited tolerance to capacitor mismatch due to the fact that they use a non-calibrated system to estimate the error voltage. In addition, these systems have typically only been applied to single stage or 1.5 bits per stage converter architectures.

Algorithmic analog-to-digital converter systems that resolve more than a single bit per stage are much more efficient for certain applications and, as such, the inability to use the calibration techniques on these multi-bit architectures is an important weakness in prior systems.

SUMMARY OF THE INVENTION

Accordingly, a need has arisen for an analog-to-digital converter architecture that allows for digital self-calibration but reduces first order error in the calibration and allows for calibration in multibit converter architectures that resolve multiple bits per stage.

In accordance with the teachings of the present invention an analog-to-digital converter architecture is provided that substantially reduces or eliminates disadvantages associated with prior systems and techniques. According to one embodiment of the present invention, a method of operating an analog-to-digital converter is provided that comprises the step of sampling a reference signal having a known voltage. The method then digitizes the sampled voltage using a multi-stage, analog-to-digital converter to yield a first order digitized error value that is a function of the mismatch between the capacitive values of capacitors within the analog-to-digital converter. The method then proceeds to calculate a second order digital error value by using the first order digital error value to correct partially the value of the digitized input voltage in the equation for the digital error value. The second order digital error value can then be used to correct the digitized output values of analog input signals having unknown voltage levels during the later operation of the analog-to-digital converter.

According to an alternate embodiment of the present invention, the multi-order calculation of a digital error value can be used in an analog-to-digital converter having the ability to resolve multiple bits of a digitized value in a single stage of the analog-to-digital converter.

According to an alternate embodiment of the present invention, the digital error value can be calculated in an iterative fashion. For example, the second order digital error value can be used to calculate in an identical manner a third order digital error value. This process can continue to an arbitrary order to iteratively increase the accuracy of the digital error value.

BRIEF DESCRIPTION OF THE DRAWINGS

A more complete understanding of the teachings of the present invention and the advantages thereof can be acquired by referring to the accompanying figures in which like reference numbers indicate like features and wherein:

FIG. 1 is a block diagram of an analog-to-digital converter system having calibration capabilities constructed according to the teachings of the present invention;

FIGS. 2a and 2b are schematic diagrams of a single bit analog-to-digital converter stage constructed according to the teachings of the present invention; and FIGS. 3a and 3b are schematic diagrams of a multiple bit analog-to-digital converter stage constructed according to the teachings of the present invention.

DETAILED DESCRIPTION OF THE INVENTION

FIG. 1 is a block diagram of an analog-to-digital converter system indicated generally at 10 that comprises a multi-stage analog-to-digital converter 12 that receives an analog input voltage $V_{IN}$. The operation of analog-to-digital converter system 12 will be discussed more completely with reference to later figures, however, in general, analog-to-digital converter system 12 comprises an algorithmic analog-to-digital converter that comprises a serial connection of converter stages. Each of the converter stages is operable to generate one or more bits of a digital word that represents an instantaneous value of the analog voltage $V_{IN}$. The digital outputs of the converter stages are supplied to a memory system 14. The outputs are also supplied to a calibration system 16. Finally, the digital outputs are available to an arithmetic logic unit 18. The arithmetic logic unit 18 is operable to receive the raw digital representation of the input voltage from the converter system 12 and error correction values from the calibration system 16. Arithmetic logic unit 18 is operable to combine the values received from systems 12 and 16 to generate a calibrated output which reduces or eliminates errors associated with offset voltages and component mismatches within the stages of the analog-to-digital converter system 12. As will be discussed herein, the calibration system 16 is operable to perform multi-order calibration to generate extremely accurate error correction values for use by arithmetic logic unit 18. Calibration system 16 is able to perform these calculations for analog-to-digital converter system 12 whether system 12 comprises single bit stages or multi-bit stages.

FIG. 2a is a schematic diagram of one converter stage that can be used within analog-to-digital converter system 12. FIG. 2a illustrates a single bit stage 20 that comprises an amplifier 22. Amplifier 22 comprises a positive input connected to ground potential. The inverting input of amplifier 22 is connected to the output of amplifier 22 and to the top plates of two parallel capacitors $C_1$ and $C_2$. Amplifier 22 operates with a suitably large gain on the order of one thousand or one million. The bottom plates of capacitors $C_1$ and $C_2$ are connected to an input voltage $V_{IN}$. Input voltage $V_{IN}$ is also connected to a comparator 24 which at an appropriate time within the sampling phase of operation compares an instantaneous value of the input voltage with a signal that comprises one-half of a reference voltage $V_{REF}$. The output of comparator 24 comprises a digital variable d which will be equal to a logical 0 if the sampled voltage is less than one-half of $V_{REF}$ and will be a logical 1 if the sampled voltage is greater than one-half of $V_{REF}$. The digital signals output by each stage in the form of the variable d are communicated to memory system 14 and to calibration system 16 for use in the calibration techniques which will be described later. The outputs of the comparators of each stage also comprise the raw output of the analog-to-digital converter system 12. In addition, as will be discussed herein, the comparator output of each stage is used to control the operation of the stage when it transmits an amplified voltage to the successive stage for resolution of lesser order bits within the digital output word.

FIG. 2a illustrates the configuration of a stage within an analog-to-digital converter during the sampling phase of operation. The input voltage $V_{IN}$ is compared by the comparator 24 to a voltage equal to one-half of the reference voltage. At the same time, an amount of charge dependent upon the value of the input voltage is stored on the capacitors $C_1$ and $C_2$. As will be discussed herein, this charge will be used to communicate a residual voltage level to a successive stage within the analog-to-digital converter system. The input voltage to the system 20 shown in FIG. 2a could be the original analog representation of a voltage signal or it could be the output of a prior stage within an integrated analog-to-digital converter system. Each stage within the analog-to-digital converter system is constructed substantially identically and operates in succession to generate bits within a digital word which represents the value of the original analog voltage.

FIG. 2b illustrates the configuration of amplifier 22 and capacitors $C_1$ and $C_2$ in the amplification phase of operation. In operation, the first stage of the integrated analog-to-digital converter system merely determines whether or not the input voltage is greater than or less than half of the reference voltage. If the input voltage was less than half the reference voltage, the difference between the input voltage and ground potential must be doubled so that the full scale from ground potential to the reference voltage can be used to communicate the residual voltage to the next stage in the converter. If the input voltage was greater than half the reference voltage, the difference between the input voltage and half the reference voltage must be doubled and communicated to the next stage. The configuration shown in FIG. 2b results in the correct voltage being communicated at the output voltage $V_{OUT}$. If the bottom plate of capacitor $C_1$ is disconnected from the input voltage and connected to the output of amplifier 22 and if the bottom plate of capacitor $C_2$ is connected to either ground potential or the reference voltage depending upon the value of d, then the output voltage $V_{OUT}$ will be equal to twice the input voltage if d=0 or it will be equal to twice the input voltage less the reference voltage if d=1.

The successive processes of sampling and amplifying using the configurations shown in FIGS. 2a and 2b can thus be accomplished by a serial connection of stages to generate successively lesser order bits of a digital word representing an original input voltage.

The operation described previously communicates the exact required voltage to a successive stage only if capacitors $C_1$ and $C_2$ are of identical capacitances. The actual equation for the voltage communicated to the successive stage is:

$$V_{OUT}=(C_1+C_2)/C_1 \times V_{IN} - d \times C_2/C_1 \times V_{REF}$$

If $C_1=C_2$, this equation reduces to the previously described equation $V_0=2V_{IN}-V_{REF}$. Due to process variations and other imperfections, $C_1$ and $C_2$ can never be made to have identical capacitances on a consistent basis. As such, it is important to be able to measure the difference between the capacitances and calibrate the system to account for these differences. In the systems described in FIGS. 2a and 2b, if:

$$C_2=C_1(1+\alpha)$$

then the output voltage is given by the express $$V_{OUT}=(2+\alpha) \times V_{IN} - d(1+\alpha)V_{REF}$$

If this is compared to the ideal expression given previously, the error voltage an be expressed as:

$$D(-V_{ERR})=\alpha \times V_{IN} - d\alpha V_{REF}$$

If a digital version of this error voltage can be accurately assessed, the digital version of $V_{ERR}$ can be subtracted from the digital word representing the raw output of the analog-to-digital converter to achieve a calibrated digital output.

Accordingly, what is needed is a digitized version of the negative of the error voltage $D(-V_{ERR})$. Because by definition the digital version of the reference voltage $D(V_{REF})=1$. The required quantity is given by:

$$D(-V_{ERR})=-\alpha D(V_{IN})+D(i)\alpha$$

For the ith stage of a multistage algorithmic analog-to-digital converter, the input voltage can be expanded as a binary weighted sum and the above expression can thus be written as:

$$D(-V_{ERR})=-\alpha(D(i)\div 2+D(i+1)\div 2^2+D(i+2)\div 2^3+\ldots)+D_{(i)}\alpha$$

This expression will give a first order calibration quantity or digital error voltage that can be combined with the raw output of the analog-to-digital converter to reduce the effect of capacitor mismatch. However, the expression includes a digitized version of the input voltage which is approximated as a binary weighted sum in the above expression. In the first order expression above the binary weighted sum is non-calibrated and thus includes the error resulting from any capacitor mismatch within the structure. According to the teachings of the present invention, the calibrated digital output can be used as an improved approximation of $V_{IN}$. This operation can greatly improve the resolution of the integrated analog-to-digital converter system compared to the first order calibration described previously.

According to the teachings of the present invention, the calibration process begins with the same measurement described previously to achieve a digital value of the capacitor mismatch $\alpha$ by sampling a known quantity such as ground potential. Once $\alpha$ is digitized and stored, the first order calibration word $D(-V_{ERR})$ is computed. The second order calibration word $D(-V_{ERR}2)$ is then given by:

$$D(-Verr2)=\alpha((D(i)/2+D(i+1)/2^2+D(i+2)/2^3+\ldots)+D)(-Verr))+D(i)\alpha=-\alpha(D(i)/2+D(i+1)/2^2+D(i+2)/2^3+\ldots)+D(i)\alpha$$

$$+\alpha^2(D(i)/2+D(i+1)/2^2+D(i+2)/2^3+\ldots)-\alpha^2 D(i)$$

$$=D(-Verr)+\alpha^2(D(i)/2+D(i+1)/2^2+D(i+2)/2^3+\ldots)-\alpha^2 D(i)$$

Both the first and second order calibrations can be performed with conventional digital adders and multipliers within either calibration system 16 or ALU 18 described with reference to FIG. 1 previously.

The second order calibration can be used further to provide an even better approximation than the first order calibrator approximation $V_{IN}$. This process can be used in an iterative fashion to arrive at a third order calibration. This process can be continued for as many iterations as are desired until a required resolution is achieved. The iterative process will converge on the theoretical digital output of the converter if it had no capacitor mismatch difficulties.

As the resolution of analog-to-digital converters is increased through the use of digital calibration techniques such as those described previously, second order effects such as, signal dependent charge injection and capacitor non-linearity start to limit the resolution. An effective way of combating these second order effects is to use an analog-to-digital converter architecture that resolves multiple bits per stage. In these architectures, although the capacitor matching requirement is relaxed compared to a single bit per stage architecture, the generalized digital calibration technique will still improve the resolution of the analog-to-digital converter by minimizing the error due to capacitor mismatch. A generalized digital calibration method according to the teachings of the present invention will be described herein by using a four capacitor per stage architecture such as that illustrated in FIGS. 3a and 3b. Referring to FIG. 3a, a multiple bit stage indicated generally at 30 comprises an amplifier 32 and a comparator 34. The positive input of amplifier 32 is connected to ground potential. The negative input of amplifier 32 is connected to the top plates of four capacitors $C_1$, $C_2$, $C_3$ and $C_4$. The bottom plates of capacitors $C_1$, $C_2$, $C_3$ and $C_4$ are connected to the input voltage $V_{IN}$. The input voltage $V_{IN}$ is also connected to one input of a comparator system 34. The remaining input of comparator 34 is connected to a reference voltage $V_{REF}$. The negative input of amplifier 32 is also connected to the output of amplifier 32. In FIG. 3a the components comprising stage 30 are shown in a sampling mode. In this mode, the instantaneous value of the input voltage $V_{IN}$ is stored on capacitors $C_1$, $C_2$, $C_3$ and $C_4$. In addition, the instantaneous value of input voltage $V_{IN}$ is compared to the reference voltage $V_{REF}$ and a digital output D results from the value of $V_{IN}$. The digital output of comparator 34 has seven possible values ranging from $-3$ to $+3$.

FIG. 3b illustrates the components of stage 30 in an amplification phase where they will pass on an amplified residual voltage to the next stage in the converter system. The bottom plate of capacitor $C_1$ is connected to the output of amplifier 32. The bottom plates of capacitors $C_2$, $C_3$ and $C_4$ are connected to either ground potential, the reference voltage $V_{REF}$ or the inverse of the reference voltage $V_{-REF}$. These connections are made depending on the value of the output to comparator 34. The range of the input voltage, the resulting digital output from comparator 34 and the resulting output voltage are given in the following Table 1.

TABLE 1

| $V_{IN}$ | digital decision | $V_o$ |
| --- | --- | --- |
| $-V_{REF} \leq V_{IN} < -\left(\frac{5}{8}\right)V_{REF}$ | $-3$ | $\left(\frac{C1+C2+C3+C4}{C1}\right)\cdot V_{IN} + \left(\frac{C2+C3+C4}{C1}\right)\cdot V_{REF}$ |
| $\left(\frac{5}{8}\right)V_{REF} \leq V_{IN} < -\left(\frac{3}{8}\right)V_{REF}$ | $-2$ | $\left(\frac{C1+C2+C3+C4}{C1}\right)\cdot V_{IN} + \left(\frac{C2+C3}{C1}\right)\cdot V_{REF}$ |
| $\left(\frac{3}{8}\right)V_{REF} \leq V_{IN} < -\left(\frac{1}{8}\right)V_{REF}$ | $-1$ | $\left(\frac{C1+C2+C3+C4}{C1}\right)\cdot V_{IN} + \left(\frac{C2}{C1}\right)\cdot V_{REF}$ |
| $\left(\frac{1}{8}\right)V_{REF} \leq V_{IN} < -\left(\frac{1}{8}\right)V_{REF}$ | $0$ | $\left(\frac{C1+C2+C3+C4}{C1}\right)\cdot V_{IN}$ |
| $\left(\frac{1}{8}\right)V_{REF} \leq V_{IN} < \left(\frac{3}{8}\right)V_{REF}$ | $1$ | $\left(\frac{C1+C2+C3+C4}{C1}\right)\cdot V_{IN} - \left(\frac{C2}{C1}\right)\cdot V_{REF}$ |
| $\left(\frac{3}{8}\right)V_{REF} \leq V_{IN} < -\left(\frac{5}{8}\right)V_{REF}$ | $2$ | $\left(\frac{C1+C2+C3+C4}{C1}\right)\cdot V_{IN} - \left(\frac{C2+C3}{C1}\right)\cdot V_{REF}$ |
| $\left(\frac{5}{8}\right)V_{REF} \leq V_{IN} < V_{REF}$ | $3$ | $\left(\frac{C1+C2+C3+C4}{C1}\right)\cdot V_{IN} - \left(\frac{C2+C3+C4}{C1}\right)\cdot V_{REF}$ |

From Table 1, it can be seen that the residual output from each stage can be concisely expressed as:

$$V_o = \begin{cases} \left(\dfrac{\sum_{i=1}^{4} Ci}{C1}\right) \cdot VIN + \left(\dfrac{\sum_{i=2}^{-d+1} Ci}{C1}\right) VREF, & \text{if } d<0 \\ \left(\dfrac{\sum_{i=1}^{4} Ci}{C1}\right) \cdot VIN, & \text{if } d=0 \\ \left(\dfrac{\sum_{i=1}^{4} Ci}{C1}\right) \cdot VIN - \left(\dfrac{\sum_{i=2}^{d+1} Ci}{C1}\right) VREF, & \text{if } d>0 \end{cases}$$

Assuming the ith capacitor mismatch is given by:

$Ci=(1+\alpha i)C1$.

Then the prior equation can be expressed as:

$$V_o = \begin{cases} \left(4+\sum_{i=1}^{4}\alpha i\right) \cdot VIN + \left(\sum_{i=2}^{-d+1}(1+\alpha i)\right) VREF, & \text{if } d<0 \\ \left(4+\sum_{i=1}^{4}\alpha i\right) \cdot VIN, & \text{if } d=0 \\ \left(4+\sum_{i=1}^{4}\alpha i\right) \cdot VIN - \left(\sum_{i=2}^{d+1}(1+\alpha i)\right) VREF, & \text{if } d>0 \end{cases}$$

The necessary digital calibration quantity is then $$D(-Verr) = \begin{cases} -\left(\sum_{i=1}^{4}\alpha i\right) \cdot D(VIN) - \left(\sum_{i=2}^{-d+1}(1+\alpha i)\right), & \text{if } d<0 \\ -\left(\sum_{i=1}^{4}\alpha i\right) \cdot D(VIN), & \text{if } d=0 \\ -\left(\sum_{i=1}^{4}\alpha i\right) \cdot D(VIN) - \left(\sum_{i=2}^{d+1}\alpha i\right), & \text{if } d>0 \end{cases}$$

Where,

D(VIN) is given by the following equation in the cases of a first-order calibration:

$D(VIN)=[D(i)/4+D(i+1)/16+D(i+1)/64+\ldots]$

The calibration process of the present invention begins with a measurement of each of the capacitor mismatches with respect to capacitor $C_1$ which operates as the feedback capacitor in the amplification stage. For example, $\alpha_3$, the capacitor mismatch of $C_4$ is measured by first connecting the ground plates of $C_2$ through $C_4$ to ground potential and the bottom plate of $C_1$ to the reference voltage $V_{REF}$. Next, using the configuration shown in FIG. 3b, the mismatch of $C_4$ to $C_1$ can be measured by connecting the bottom plates of $C_2$ and $C_3$ to ground potential and the bottom plate of $C_4$ to the reference voltage $V_{REF}$. As shown in FIG. 3b, the bottom plate of $C_1$ is connected to the output voltage $V_{OUT}$. In this configuration, the output of the amplifier 32 is equal to $-\alpha_3 \times V_{REF}$. This voltage can be digitized by the following stages of the pipeline converter system.

Identical techniques can be used to measure $\alpha_1$ and $\alpha_2$. For example, to measure $\alpha_1$ the circuit is identical in the sampling phase. During the amplification phase, the bottom plate of $C_2$ instead of $C_4$ is connected to the reference voltage $V_{REF}$.

In practice, the output of the amplifier 32 will have an offset due to mechanisms such as charge injection of the sampling switch. According to the teachings of the present invention, this offset can be measured and subtracted from the measurement for capacitor mismatch described above. The offset value can be measured by sampling it on capacitors $C_1$ through $C_4$ with the bottom plates of each of these capacitors connected to ground. During the amplification phase, the bottom plates of capacitor $C_2$ through $C_4$ remain connected to the ground potential. The bottom plate of capacitor $C_1$ is connected to the output of the amplifier 32. In this configuration, the voltage on the output of amplifier 32 will be the offset voltage. This voltage can then be digitized by the remaining stages in the pipeline to analog-to-.digital converter system. The digital value of the offset voltage can thus be subtracted to further calibrate the system. Once the mismatch values; $\alpha_1$, $\alpha_2$ and $\alpha_3$ are measured, the prior equation can be used to compute the necessary calibration quantity $D(-V_{ERR})$. For example, when d=−3, $D(-Verr)=-(\alpha 1+\alpha 2+\alpha 3+\alpha 4)[D(i+1)/16+D(i+1)/64+\ldots ]-(\alpha+\alpha 2+\alpha 3)D(i)$.

As with the prior single bit per stage architecture, the computations described can be performed with conventional digital adders and multipliers. The calibration techniques of the present invention are not only general in the sense that they can be applied to architectures with multiple bits per stage, but also to architectures with digital error correction capabilities. In many multi-bit per stage architectures with digital error correction, instead of increasing the number of comparators as for example in the case of a 1.5 bit per stage architecture, the number of capacitors is reduced by a factor of two. The generalized calibration technique described here is equally valid for this class of algorithmic analog-to-digital converters. For example, in the example given above, four capacitors and six comparators are used per stage. In many multiple bit per stage architectures, the stage is conceived as a 3 bit per stage using seven comparators. To accommodate digital error corrections, the number of capacitors is reduced from eight to four yielding an effective two bit per stage comparator. The capacitor structure in both of these cases is the same however. The consequence of changing the number of comparators from six to seven as is typically used in a three bit per stage architecture with digital error correction merely changes how the digital output is coded. Provided that the calibration logic takes this change of coding into account, the calibration techniques of the present invention remain equally applicable.

Accordingly, digital calibration techniques for an algorithmic analog-to-digital converter are proposed that allow for multi-order calibration in an iterative fashion to achieve any desired resolution. In addition, the techniques can be used to eliminate errors due to offsets within the amplifiers used within the stages of the converter. The techniques are equally applicable to converter architectures that resolve multiple bits per stage and architectures that utilize digital error correction techniques.

What is claimed is:

1. A method of converting an analog signal to a digital representation comprising the steps of:

sampling an input reference signal at the input to an analog to digital converter system comprising a series of converter stages;

creating and storing a digital reference value associated with the sampled input reference signal;

calculating a first order digital error value using the digital reference value, the first order digital error value associated with error introduced by imperfections in the converter stages; and calculating a second order digital error value as a function of the digital reference value and the first order digital error value.

2. The method of claim 1 and further comprising the step of using the second order digital error value to calibrate raw digital representations of analog input signals generated by the analog to digital converter system.

3. The method of claim 1 and further comprising the step of calculating a third order digital error value as a function of the digital reference value and the second order digital error value.

4. The method of claim 3 and further comprising the step of using the third order digital error value to calibrate raw digital representations of analog input signals generated by the analog to digital converter system.

5. The method of claim 1 wherein the input reference signal comprises a voltage signal associated with ground potential.

6. The method of claim 1 wherein each of the converter stages comprises a capacitor array comprising capacitors having capacitances of substantially the same magnitude and wherein the operation of the method operates to reduce or eliminate error associated with the differences in the capacitance of the capacitors within the capacitor arrays.

7. The method of claim 1 wherein each converter stage is operable to resolve a single bit of a digital word representing a sampled analog input signal.

8. The method of claim 1 wherein each converter stage is operable to resolve a plurality of bits of a digital word representing a sampled analog input signal.

9. The method of claim 1 wherein the step of creating and storing a digital reference value comprises the steps of:

sampling an input signal at each converter stage;

comparing the sampled input signal to at least one reference signal;

generating at least one bit of a digital output word responsive to the comparison; and in all but a final converter stage, generating and transmitting a residual signal to a subsequent converter stage using the generated bit and charge stored in the step of sampling an input signal.

10. An analog to digital converter system for converting an analog signal to a digital representation comprising:

circuitry for sampling an input reference signal input to a first converter stage of the analog to digital converter system;

circuitry including the first converter stage and subsequent converter stages for creating and storing a digital reference value associated with the sampled input reference signal;

circuitry for calculating a first order digital error value using the digital reference value, the first order digital error value associated with error introduced by imperfections in the first and subsequent converter stages; and circuitry for calculating a second order digital error value as a function of the digital reference value and the first order digital error value.

11. The system of claim 10 and further comprising circuitry for using the second order digital error value to calibrate raw digital representations of analog input signals generated by the converter stages.

12. The system of claim 10 wherein the input reference signal comprises a voltage signal associated with ground potential.

13. The system of claim 10 wherein each of the converter stages comprises a capacitor array comprising capacitors having capacitances of substantially the same magnitude and wherein the system operates to reduce or eliminate error associated with the differences in the capacitance of the capacitors within the capacitor arrays.

14. The system of claim 10 wherein each converter stage is operable to resolve a single bit of a digital word representing a sampled analog input signal.

15. The system of claim 10 wherein each converter stage is operable to resolve a plurality of bits of a digital word representing a sampled analog input signal.

16. The system of claim 10 wherein each converter stage but the last comprises:

circuitry for sampling an input signal and storing an amount of charge associated with the magnitude of the input signal in a capacitive array;

circuitry for comparing the sampled input signal to at least one reference signal;

circuitry for generating at least one bit of a digital output word responsive to the comparison; and circuitry for generating and transmitting a residual signal to a subsequent converter stage using the generated bit and charge stored in the capacitive array.

17. The system of claim 16 wherein the circuitry for generating and transmitting a residual signal comprises an operational amplifier selectively coupled to the capacitive array.

* * * * *